(12) United States Patent
Huang et al.

(10) Patent No.: US 7,420,793 B2
(45) Date of Patent: Sep. 2, 2008

(54) CIRCUIT SYSTEM FOR PROTECTING THIN DIELECTRIC DEVICES FROM ESD INDUCED DAMAGES

(75) Inventors: Shao-Chang Huang, Hsinchu (TW); Jian-Hsing Lee, Hsinchu (TW); Yi-Hsun Wu, HsinChu (TW); Jiaw-Ren Shih, Tsing-chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/332,565

(22) Filed: Jan. 12, 2006

(65) Prior Publication Data
US 2007/0159754 A1    Jul. 12, 2007

(51) Int. Cl.
*H02H 9/00*    (2006.01)
(52) U.S. Cl. .................................. 361/111; 361/56
(58) Field of Classification Search ................. 361/56, 361/91.1, 111; 257/355–360
See application file for complete search history.

(56) References Cited

U.S. PATENT DOCUMENTS

| | | | | |
|---|---|---|---|---|
| 5,089,875 A | * | 2/1992 | Koyama | ...................... 257/532 |
| 5,301,081 A | * | 4/1994 | Podell et al. | ................... 361/56 |
| 5,706,163 A | * | 1/1998 | Kalb et al. | .................... 361/313 |
| 6,404,275 B1 | * | 6/2002 | Voldman et al. | ............. 327/538 |
| 6,635,548 B2 | * | 10/2003 | Bernstein et al. | ............. 438/387 |
| 6,862,160 B2 | * | 3/2005 | Maloney et al. | ................ 361/56 |
| 6,934,136 B2 | * | 8/2005 | Duvvury | ...................... 361/56 |
| 6,936,895 B2 | * | 8/2005 | Manna et al. | ................ 257/355 |
| 2002/0084490 A1 | * | 7/2002 | Ker et al. | ..................... 257/355 |
| 2004/0105203 A1 | * | 6/2004 | Ker et al. | ...................... 361/56 |

* cited by examiner

*Primary Examiner*—Michael J Sherry
*Assistant Examiner*—Danny Nguyen
(74) *Attorney, Agent, or Firm*—K & L Gates LLP

(57) ABSTRACT

A circuit system is disclosed for protecting a capacitor coupled between a voltage supply node and a complementary voltage supply node from an ESD. The circuit system includes at least one NMOS transistor having a drain coupled to the voltage supply node, a source and a gate together coupled to the complementary voltage supply node, and at least one diode chain having one or more diodes serially coupled between the voltage supply node and the complementary voltage supply node. During an ESD event, the diode chain and the NMOS transistor dissipate an ESD current from the voltage supply node to the complementary voltage supply node, thereby protecting the capacitor from ESD induced damages.

16 Claims, 5 Drawing Sheets

CIRCUIT SYSTEM FOR PROTECTING THIN DIELECTRIC DEVICES FROM ESD INDUCED DAMAGES

BACKGROUND

The present invention relates generally to an integrated circuit (IC) design, and more particularly to a circuit system for protecting a capacitor from electrostatic discharge (ESD).

Electrostatic discharge (ESD) often occurs in a very short period of time. Even a small amount of ESD charge can produce an extremely high voltage when the ESD current flows through an electronic device, and cause serious damages. For example, during an ESD event, a high voltage difference can be created at two ends of a capacitor and damage the dielectric layer disposed therebetween.

An ESD protection device is typically implemented in an IC for protecting the electronic devices within the IC from ESD induced damages. One of the ESD protection devices is a grounded-gate NMOS (GGNMOS) transistor. The GGNMOS transistor is typically coupled in parallel to a protected device between a voltage supply node and ground. The GGNMOS transistor has no impact on the normal operation of the protected device, as its gate is coupled to ground. During an ESD event, the GGNMOS transistor passes the ESD current thereacross due to the junction breakdown induced by the high ESD voltage. The GGNMOS transistor creates a current path for the ESD current to bypass the protected device, thereby protecting it from ESD induced damages.

While the GGNMOS transistor is effective in protecting devices manufactured by a processing technology of a 90 nm or higher generation, it cannot properly protect devices manufactured by a processing technology of a 65 nm or lower generation. For example, a capacitor manufactured by the 65 nm processing technology usually has a dielectric layer with a thickness smaller than 14 angstroms. This thin dielectric layer is very susceptible to high voltage induced damages. During an ESD event, the capacitor can be damaged before the GGNMOS transistor is triggered on. As the processing technology advances, the dielectric layer becomes thinner, and the ESD induced damage issues become increasingly serious.

Thus, what is needed is an improved ESD protection circuit that can better protect devices manufactured by the processing technology of a 65 nm or lower generation from ESD induced damages.

SUMMARY

The present invention discloses a circuit system for protecting a capacitor coupled between a voltage supply node and a complementary voltage supply node from an ESD. In one embodiment of the present invention, the circuit system includes at least one NMOS transistor having a drain coupled to the voltage supply node, a source and a gate together coupled to the complementary voltage supply node, and at least one diode chain having one or more diodes serially coupled between the voltage supply node and the complementary voltage supply node. During an ESD event, the diode chain and the NMOS transistor dissipate an ESD current from the voltage supply node to the complementary voltage supply node, thereby protecting the capacitor from ESD induced damages.

The construction and method of operation of the invention, however, together with additional objects and advantages thereof will be best understood from the following description of specific embodiments when read in connection with the accompanying drawings.

DESCRIPTION

Figure 1:
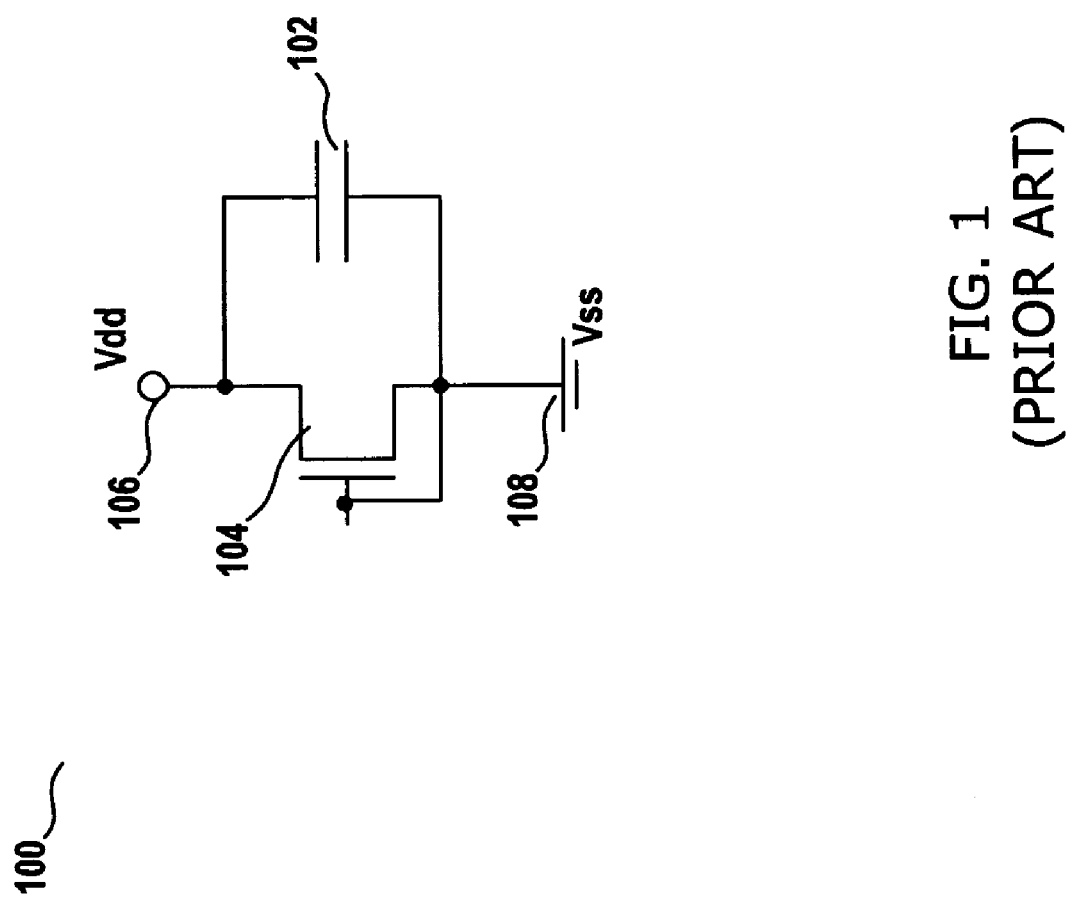
FIG. 1 schematically illustrates a conventional ESD protection circuit system.

FIG. 1 schematically illustrates a conventional ESD protection circuit system 100, which includes a capacitor 102 and a GGNMOS transistor 104. The capacitor 102 is coupled between a voltage supply node 106 receiving an operating voltage Vdd and a complementary voltage supply node 108 connecting to ground or any complementary operating voltage Vss that is lower than Vdd. The GGNMOS transistor 104 having a drain coupled to the voltage supply node 106 and a source is coupled to the complementary voltage supply node 108. The gate of the GGNMOS transistor 104 is also coupled to the complementary voltage supply node 108. If the capacitor 102 has a dielectric layer with a thickness equal to or greater than 16 angstroms, the GGNMOS transistor 104 will be triggered on quickly enough during an ESD event, thereby protecting the capacitor 102 from ESD induced damages. However, if the dielectric thickness of the capacitor 102 is smaller than 14 angstroms, the GGNMOS transistor 104 will often not be triggered on before the ESD current damages the capacitor 102.

Figure 2:
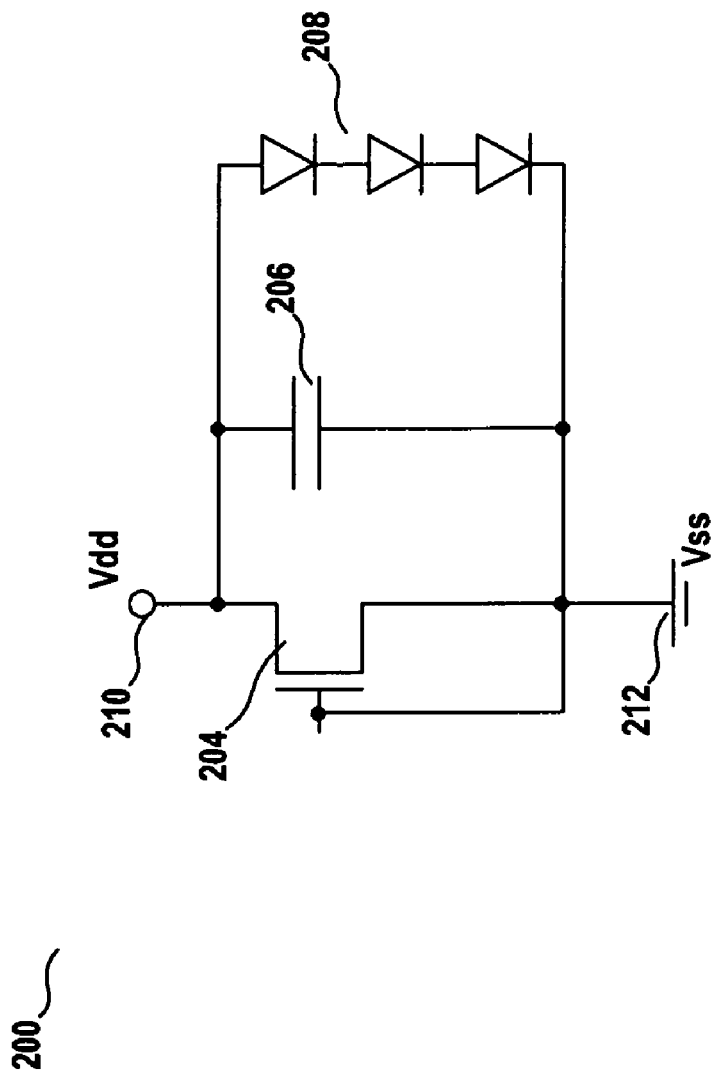
FIG. 2 schematically illustrates an ESD protection circuit system in accordance with one embodiment of the present invention.

FIG. 2 schematically illustrates an ESD protection circuit system 200 in accordance with one embodiment of the present invention. The ESD protection circuit system 200 includes a GGNMOS transistor 204, a capacitor 206, and a diode chain 208. The capacitor 206 is coupled between a voltage supply node 210 receiving an operating voltage Vdd and a complementary voltage supply node 212 connected to ground or any complementary operating voltage Vss that is lower than Vdd. The capacitor 206, the device to be protected, can be any dielectric layer having a voltage difference thereacross. For example, the capacitor 206 can be a typical capacitor constructed by a dielectric layer sandwiched by two conductive plates, or a gate capacitor constructed by a gate dielectric between a semiconductor channel region and a gate conductive layer.

The GGNMOS transistor 204 is coupled between the voltage supply node 210 and the complementary voltage supply node 212 parallel to the capacitor 206. The GGNMOS transistor 204 has a drain coupled to the voltage supply node 210 and a source coupled to the complementary voltage supply node 212. The gate of the GGNMOS transistor 204 is also coupled to the complementary voltage supply node 212. The diode chain 208 includes one or more diodes serially connected between the voltage supply node 210 and the complementary voltage supply node 212 parallel with the GGNMOS transistor 204 and the capacitor 206. The anode and the cathode of the diode chain 208 are connected to the voltage supply node 210 and the complementary voltage supply node 212, respectively. Such diode chain 208 is referred to as a Darlington circuit by many skilled artisans in the IC design field.

The GGNMOS transistor 204 and the diode chain 208 function as an ESD protection circuit for protecting the capacitor 206 from ESD induced damages during an ESD event. The combination of the GGNMOS transistor 204 and the diode chain 208 are particularly suitable for protecting the capacitor 206 that has a dielectric layer with a thickness smaller than 14 angstroms, which is a characteristic of the devices manufactured by a semiconductor processing technology of a 65 nm or lower generation.

During a normal operation, the GGNMOS transistor 204 and the diode 208 are designed to have no impact on the capacitor 210. The GGNMOS transistor 204 is normally turned off, since its gate is coupled to the complementary voltage supply node 212. The combined voltage drop across the diode chain 208 is designed to be smaller than the operating voltage Vdd received at the voltage supply node 210 for avoiding a current to flow from the voltage supply node 210 to the complementary voltage supply node 212. In a case where each diode within the diode chain 208 provides a substantially equal voltage drop, the number of the diodes multiplied by the voltage drop should be greater than the operating voltage. For example, if the operating voltage ranges approximately from 1.0 to 1.5 volts and the voltage drop provided by each diode ranges approximately from 0.5 to 0.7 voltages, the diode chain 208 should contain at least three diodes.

During an ESD event, the diode chain 208 is designed to conduct earlier than the GGNMOS transistor 204. In other words, the combined voltage drop across the diode chain 208 is designed to be smaller than the trigger-on voltage of the GGNMOS transistor 204. The diode chain 208 provides a current dissipation capacity for the circuit system 200 in the early stage of the ESD event. This helps to reduce the voltage stress for the capacitor 206. As the semiconductor processing technology advances and the dielectric thickness of the capacitor 206 becomes lower than 14 angstroms, this earlier current dissipation capacity is crucial for the capacitor 206 to survive the ESD. Shortly after the diode chain 208 conducts, the ESD voltage will trigger on the GGNMOS transistor 204 for further dissipating the ESD current from the voltage supply node 210 to the complementary voltage supply node 212. The GGNMOS transistor 204 is designed to be much larger in size than the diode within the diode chain 208. Thus, the GGNMOS transistor 204 is able to dissipate the ESD current more efficiently than the diode chain 208.

Figure 3:
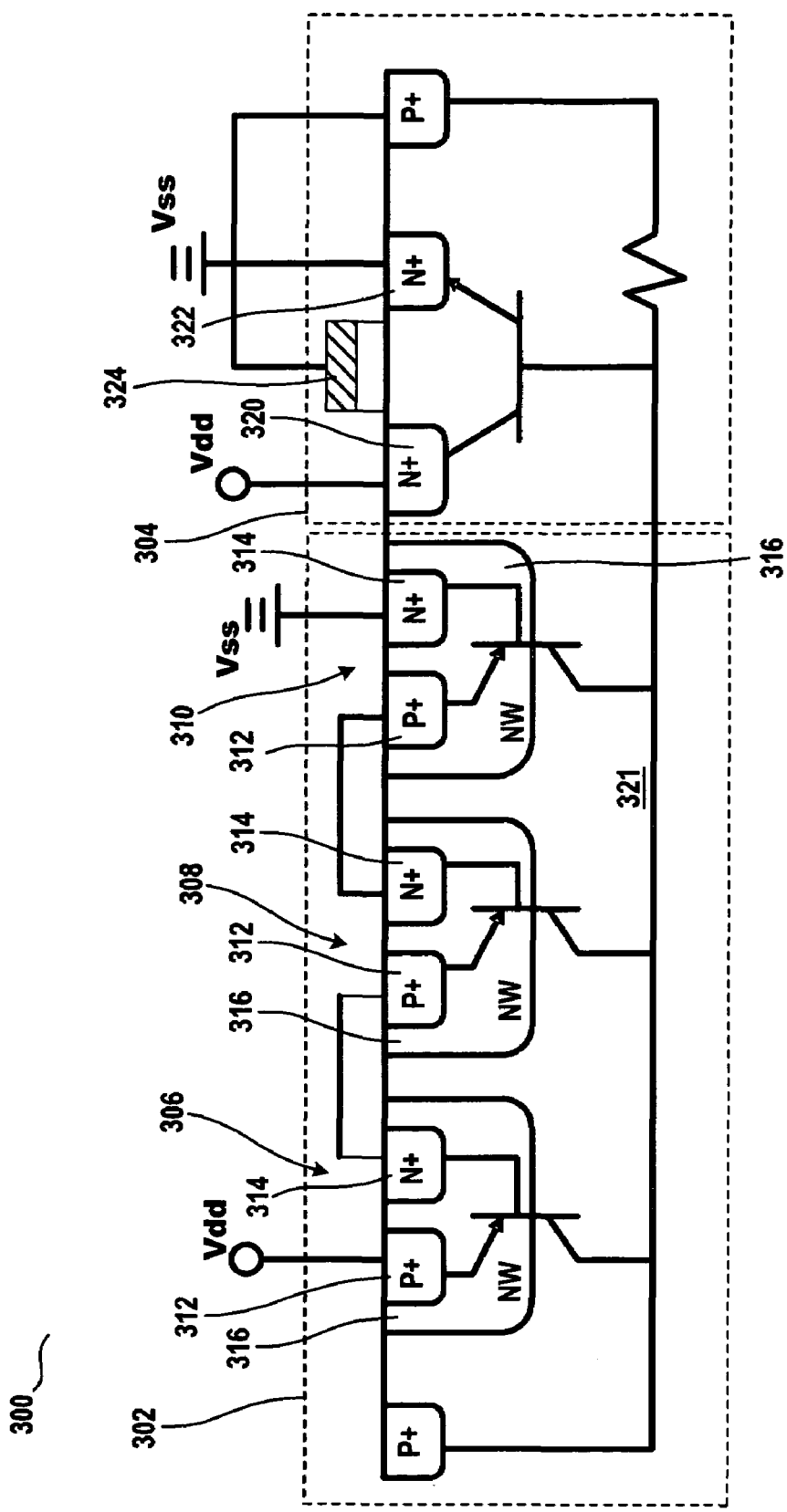
FIG. 3 illustrates a cross-sectional view of a semiconductor structure equivalent to the ESD protection circuit system in accordance with one embodiment of the present invention.

FIG. 3 illustrates a cross-sectional view of a semiconductor structure 300 equivalent to the ESD protection circuit system 200 shown in FIG. 2 in accordance with one embodiment of the present invention. Referring to both FIGS. 2 and 3, the semiconductor structure 300 includes a diode chain 302, which is equivalent to the diode chain 208, and a GGNMOS transistor 304, which is equivalent to the GGNMOS transistor 204. The diode chain 302 includes a number of diodes 306, 308 and 310. Each diode 306,308 or 310 includes a P-type doped region 314 and an N-type doped region 314 placed adjacent to each other on an N-well 316. The N-type doped region 314 of the diode 306 is coupled to the P-type doped region 312 of the diode 308. The N-type doped region 314 of the diode 308 is coupled to the P-type doped region 312 of the diode 310. The P-type doped region 312 of the diode 306 is coupled to the operating voltage Vdd, while the N-type doped region 314 of the diode 310 is coupled to the complementary operating voltage Vss.

The GGNMOS transistor 304 includes a drain region 320 and a source region 322 disposed on the semiconductor substrate 321. A gate structure 324 is constructed between the doped regions 320 and 322 on the semiconductor substrate 321. The drain doped region 320 is coupled to the operating voltage Vdd, while the gate structure 324 and the source doped region 322 are coupled to the complementary operating voltage Vss.

Figure 4:
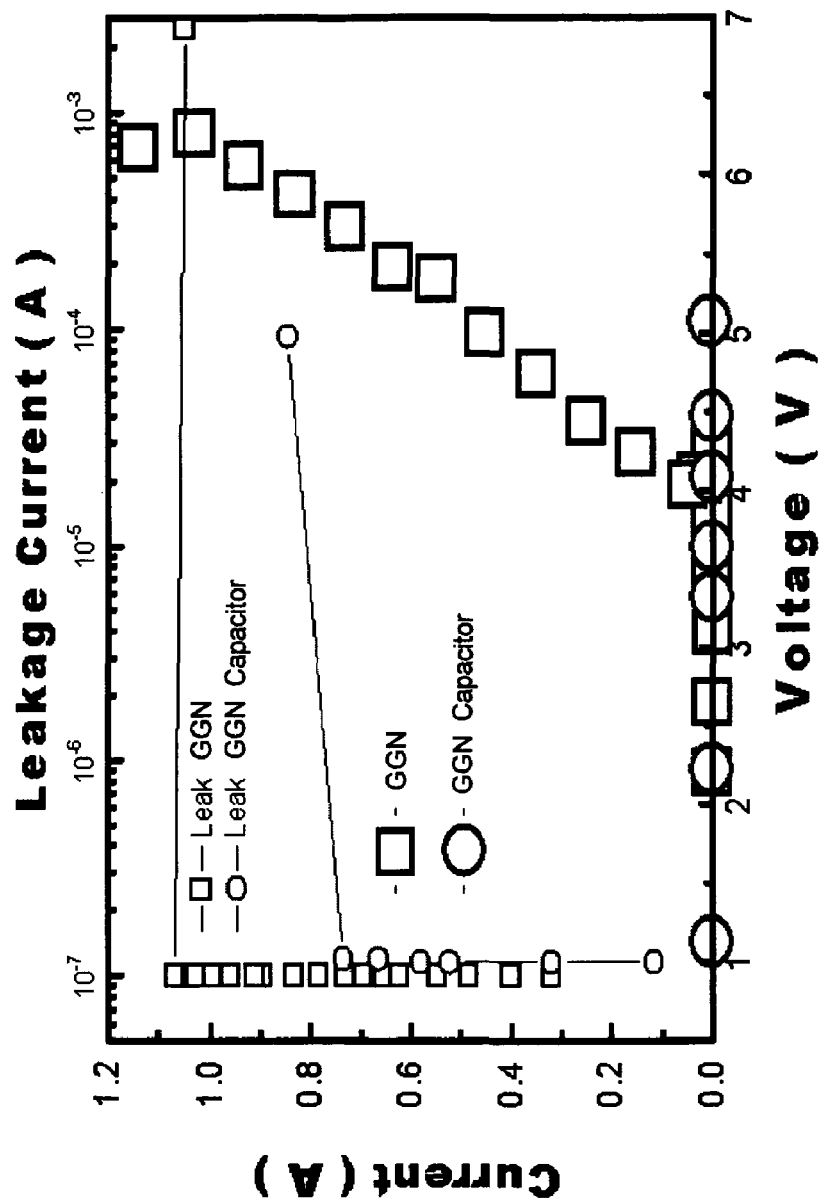
FIG. 4 illustrates a graph showing the performance of the conventional ESD protection circuit system.

FIG. 4 illustrates a graph 400 showing the performance of the conventional ESD protection circuit system 100 in FIG. 1. Referring both to FIGS. 1 and 4, in graph 400, the bottom X-axis represents the voltage at the voltage supply node 106, the Y-axis to the left represents the current flowing from the voltage supply node 106 to the complementary voltage supply node 108, and the top X-axis represents the leakage current from the voltage supply node 106 to the complementary voltage supply node 108. The square curve identified by "leak (GGN)" represents the voltage-to-leakage-current relationship for a circuit system which has only the GGNMOS transistor 104, without the capacitor 102. The circle curve identified by "leak (GGN+capacitor)" represents the voltage-to-leakage-current relationship for a circuit system that has both the GGNMOS transistor 104 and the capacitor 102. The square curve identified by "TLP (GGN)" represents the voltage-to-current relationship for a circuit system which has only the GGNMOS transistor 104, without the capacitor 102. The circle curve identified by "TLP (GGN+capacitor)" represents the voltage-to-current relationship for a circuit system that has both the GGNMOS transistor 104 and the capacitor 102.

At about 5 volts, the curve identified by "leak (GGN+capacitor)" shows an abrupt increase of leakage current, while the curve identified by "TLP (GGN+capacitor)" shows a current about 0 amps. The abrupt increase of leakage can be explained by the damage of the capacitor 102 caused by the 5 volt voltage. The GGNMOS transistor 104 is not triggered on at 5 volts, such that no current flowing thereacross can be detected. This shows that in the conventional ESD protection circuit system, during an ESD event, the capacitor 102 can be damaged earlier than when the GGNMOS transistor 104 is triggered on.

Figure 5:
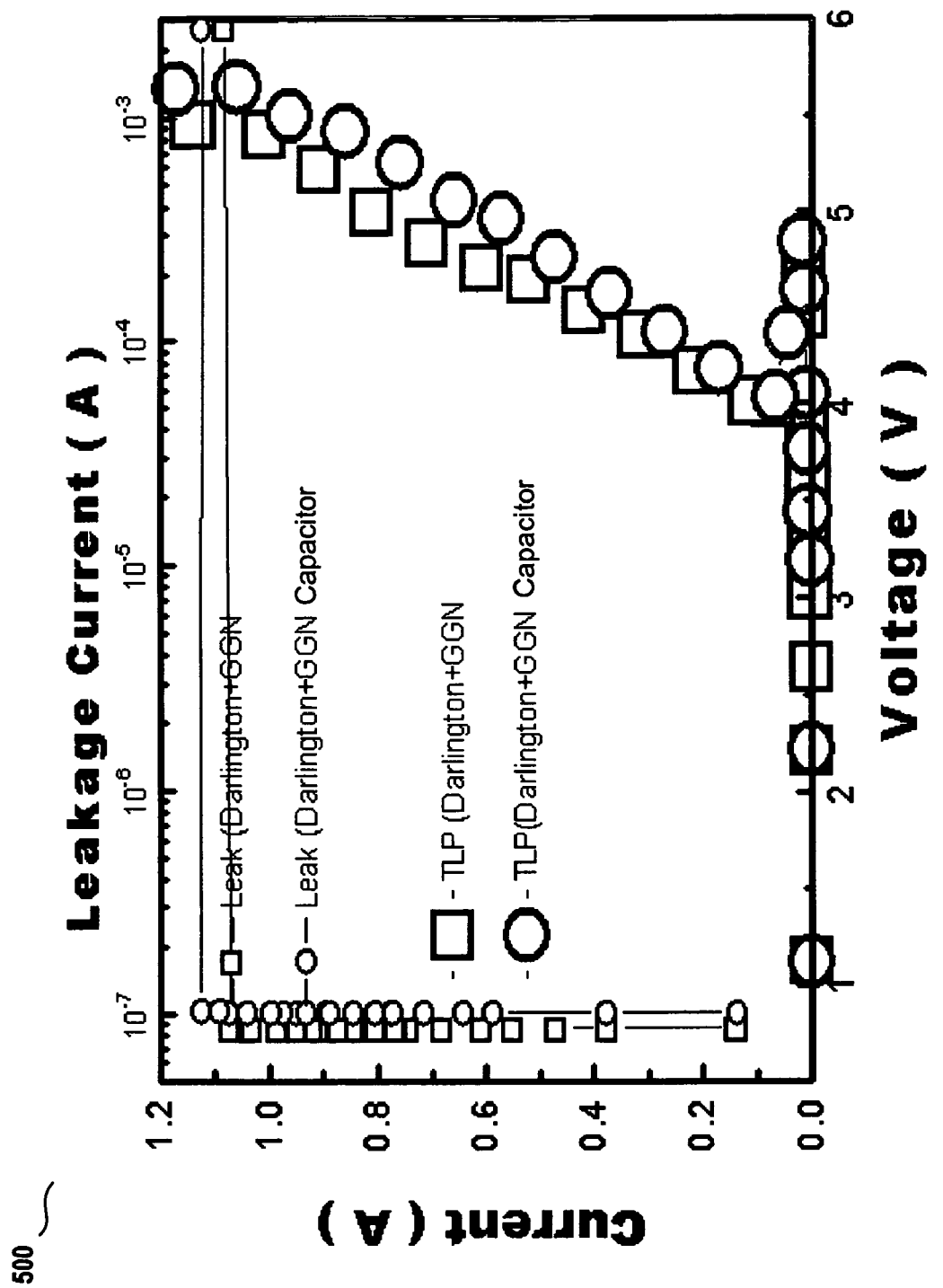
FIG. 5 illustrates a graph showing the performance of the proposed ESD protection circuit system in accordance with one embodiment of the present invention.

FIG. 5 illustrates a graph 500 showing the performance of the proposed ESD protection circuit system 200 in FIG. 2. Referring both to FIGS. 2 and 5, in graph 500, the bottom X-axis represents the voltage at the voltage supply node 210, the Y-axis to the left represents the current flowing from the voltage supply node 210 to the complementary voltage supply node 212, and the top X-axis represents the leakage current from the voltage supply node 210 to the complementary voltage supply node 212. The square curve identified by "leak (Darlington+GGN)" represents the voltage-to-leakage-current relationship for a circuit system that has the GGNMOS transistor 204 and diode chain 208, but without the capacitor 206. The circle curve identified by "leak (Darlington+GGN+capacitor)" represents the voltage-to-leakage-current relationship for a circuit system that has the GGNMOS transistor 204, the diode chain 208 and the capacitor 206. The square curve identified by "TLP (Darlington+GGN)" represents the voltage-to-current relationship for a circuit system that has the GGNMOS transistor 204 and the diode chain 208, but without the capacitor 206. The circle curve identified by "TLP (Darlington+GGN+capacitor)" represents the voltage-to-current relationship for a circuit system that has the GGNMOS transistor 204, the diode chain 208 and the capacitor 206.

It can be seen that the trigger-on voltage for the ESD protection circuit system 200 is about 4 volts, which is lower than the capacitor damage voltage 5 volts shown in FIG. 4. Thus, it is shown that the proposed ESD protection circuit system 200 can better protect the capacitor 206 from ESD induced damages as opposed to the conventional system 100 shown in FIG. 1.

The present invention discloses an ESD protection circuit system that can protect a capacitor having a dielectric thickness smaller than 14 angstroms against ESD induced damages. The dielectric of 14 angstrom thickness is a characteristic for the devices that are manufactured by a semiconductor processing technology of a 65 um or lower generation. As such, the proposed ESD protection circuit system can be used for ESD protection for IC's manufactured by various new generation processing technologies.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A circuit system for protecting a capacitor coupled between a voltage supply node and a ground node from an electrostatic discharge (ESD), the circuit system comprising:
   at least one grounded-gate NMOS transistor having a drain coupled to the voltage supply node, a source and a gate together connected to the ground node, without being coupled to a negative potential; and
   at least one PN junction diode chain having one or more diodes serially coupled between the voltage supply node and the ground node, wherein the PN junction diode chain has an anode coupled to the voltage supply node and a cathode coupled to the ground node,
   wherein a combined voltage drop across the PN junction diode chain is smaller than the trigger-on voltage of the NMOS transistor and a capacitor damage voltage,
   wherein during an ESD event, the diode chain and the NMOS transistor dissipate an ESD current from the voltage supply node to the ground node, and the PN junction diode chain is designed to be triggered on before the ESD current damages the capacitor, thereby protecting the capacitor from ESD induced damages.

2. The circuit system of claim 1 wherein the diode chain conducts earlier than the NMOS transistor during an ESD event.

3. The circuit system of claim 1 wherein the capacitor comprises a dielectric layer with a thickness smaller than 14 angstroms.

4. The circuit system of claim 1 wherein the NMOS transistor and the diode chain are in parallel.

5. The circuit system of claim 1 wherein a combined voltage drop across the diode chain is greater than an operating voltage received by the voltage supply node.

6. The circuit system of claim 5 wherein the number of the diodes multiplied by a voltage drop across each diode within the diode chain is greater than the operating voltage.

7. The circuit system of claim 6 wherein the operating voltage ranges approximately from 1.0 and 1.2 volts, the voltage drop across each diode ranges approximately from 0.5 to 0.7 volts, and the number of the diodes is equal to or greater than 3.

8. A semiconductor structure for protecting a capacitor coupled between a voltage supply node and a ground node from an electrostatic discharge (ESD), the semiconductor structure comprising:
   at least one grounded-gate NMOS transistor being constructed on a semiconductor substrate, and having a drain coupled to the voltage supply node, a source and a gate together connected to the ground node, without being coupled to a negative potential; and
   at least one PN junction diode chain being constructed adjacent to the NMOS transistor on the semiconductor substrate, and having one or more diodes serially coupled between the voltage supply node and the ground node, wherein the PN junction diode chain has an anode coupled to the voltage supply node and a cathode coupled to the ground node,
   wherein a combined voltage drop across the PN junction diode chain is smaller than the trigger-on voltage of the NMOS transistor and a capacitor damage voltage,
   wherein during an ESD event, the diode chain and the NMOS transistor dissipate an ESD current from the voltage supply node to the ground node, and the PN junction diode chain is designed to be triggered on before the ESD current damages the capacitor, thereby protecting the capacitor from ESD induced damages.

9. The semiconductor structure of claim 8 wherein the capacitor comprises a dielectric layer with a thickness smaller than 14 angstroms.

10. The semiconductor structure of claim 8 wherein each diode in the diode chain comprises a P-type doped region and an N-type doped region on an N-well.

11. The semiconductor structure of claim 10 wherein the P-type doped region of one diode is connected to the N-type doped region of its neighboring diode.

12. The semiconductor structure of claim 10 wherein the P-type doped region of one diode is connected to the voltage supply node, and the N-type doped region of another diode is connected to the ground node.

13. The semiconductor structure of claim 8 wherein a combined voltage drop across the diode chain is greater than an operating voltage received by the voltage supply node.

14. The semiconductor structure of claim 13 wherein the number of the diodes multiplied by a voltage drop across each diode within the diode chain is greater than the operating voltage.

15. An integrated circuit comprising:
   a capacitor being coupled between a voltage supply node and a ground node, and having a dielectric layer with a thickness smaller than 14 angstroms;
   at least one grounded-gate NMOS transistor having a drain coupled to the voltage supply node, a source and a gate together connected to the ground node, without being coupled to a negative potential; and
   at least one PN junction diode chain having one or more diodes serially coupled between the voltage supply node and the ground node, wherein the PN junction diode chain has an anode coupled to the voltage supply node and a cathode coupled to the ground node, wherein a combined voltage drop across the PN junction diode chain is smaller than the trigger-on voltage of the NMOS transistor and a capacitor damage voltage, wherein during an ESD event, the diode chain and the NMOS transistor dissipate an ESD current from the voltage supply node to the ground node, and the PN junction diode chain is designed to be triggered on before the ESD current damages the capacitor, thereby protecting the capacitor from ESD induced damages.

16. The integrated circuit of claim 15 wherein a combined voltage drop across the diode chain is greater than an operating voltage received by the voltage supply node.

* * * * *